(12) United States Patent
Finkler et al.

(10) Patent No.: US 7,814,443 B2
(45) Date of Patent: Oct. 12, 2010

(54) GRAPH-BASED PATTERN MATCHING IN L3GO DESIGNS

(75) Inventors: Ulrich A. Finkler, Mahopac, NY (US); Mark A. Lavin, Katonah, NY (US); Robert T. Sayah, Verbank, NY (US)

(73) Assignee: International Business Machines Corporation, Armonk, NY (US)

( * ) Notice: Subject to any disclaimer, the term of this patent is extended or adjusted under 35 U.S.C. 154(b) by 782 days.

(21) Appl. No.: 11/623,541

(22) Filed: Jan. 16, 2007

(65) Prior Publication Data

US 2008/0172645 A1  Jul. 17, 2008

(51) Int. Cl.
*G06F 17/50* (2006.01)
(52) U.S. Cl. .................... 716/2; 716/5; 716/21
(58) Field of Classification Search .............. 716/2, 716/5, 21
See application file for complete search history.

(56) References Cited

U.S. PATENT DOCUMENTS

| 7,536,664 B2 * | 5/2009 | Cohn et al. ............ 716/10 |
| 2006/0036977 A1 * | 2/2006 | Cohn et al. ............ 716/4 |
| 2009/0204930 A1 * | 8/2009 | Cohn et al. ............ 716/4 |

* cited by examiner

*Primary Examiner*—Phallaka Kik
(74) *Attorney, Agent, or Firm*—Brian Verminski; Hoffman Warnick LLC

(57) ABSTRACT

A system and method for processing glyph-based data associated with generating very large scale integrated circuit (VLSI) designs. A system is provide that includes a system for defining variable patterns using a pattern description language to create a glyph layout; and a graph-based pattern matching system that can identify potential matches amongst variable patterns in the glyph layout.

20 Claims, 3 Drawing Sheets

GRAPH-BASED PATTERN MATCHING IN L3GO DESIGNS

FIELD OF THE INVENTION

The invention relates generally relates to processing L3GO VLSI designs, and more specifically relates to a system and method of generating L3GO layouts using variable patterns, and performing graph-based pattern matching of L3GO layouts.

BACKGROUND OF THE INVENTION

L3GO (Layout using Gridded Glyph Geometry Objects) is an ongoing project for improving the manufacturability of VLSI designs. L3GO provides a restricted set of objects or patterns that describes circuit connectivity and devices, referred to as glyphs. L3GO has three types of glyphs, including:

1. Stick glyphs, which are 1-dimensional line segments drawn between two grid points, e.g., used to describe FET gates or for interconnections. The attached properties of a stick glyph include which layer the stick belongs to, the start and end point, and a target width;

2. Contact glyphs, which are 0-dimensional points lying at grid points, e.g., used to describe vertical interconnections (contacts and vias). The attached properties of a contact glyph include which layer the contact belongs to, and parameters that specify how contacts are to be arranged in a matrix, e.g. the number of rows and columns in the matrix, the size of each contact, the horizontal and vertical distances between columns and rows, respectively and an optional offset of the matrix center relative to the glyph position; and 3. Area glyphs, which are 2-dimensional, axis aligned rectangles whose vertices are on grid points, e.g., used to describe diffusion regions. In addition to their specific attributes, glyphs can carry 'design intent' attributes, e.g. net names, ratings of their importance etc. A process called elaboration turns sets of glyphs into geometry (pre-data-prep mask shapes).

A pattern describes a glyph configuration, e.g., a contact glyph with certain properties sitting on a stick glyph with another set of properties. Elaboration creates shapes for this configuration based on a set of parameters, e.g., elaboration may create a pad on an M1 stick and four redundant vias on the pad. Given the computational complexity of converting glyph patterns in VLSI designs, the identification of pre-defined or matching patterns is a key component of the elaboration process.

The manipulation of L3GO designs faces two distinct problems, variability in patterns, and resolution of ambiguities. To support pattern based design manipulation that considers interaction between multiple design features, it is impractical to use only patterns with explicit or fixed sizes. To cover all potential size configurations would require tens of thousands of patterns. Thus, patterns have to support a specification of variable properties, e.g., distances, whose values are determined when a placement of a pattern based on topological criteria is found.

In addition, there is often a basic modification that applies in a majority of situations, e.g., extending the end of a line. But under certain circumstances, e.g., if there is a specific interaction with the line end, a different solution is desired. In this situation, one pattern is a refinement of another, so that both patterns match. Mechanisms are necessary that allow the construction of an unambiguous solution for a complex set of overlapping patterns.

SUMMARY OF THE INVENTION

The present invention addresses the above-mentioned problems, as well as others, by providing a scheme that expresses patterns as variable objects, maps patterns into graphs that can be searched and grouped, and provides placement priorities for different groups of patterns.

In a first aspect, the invention provides a glyph-based processing system, comprising: a system for defining variable patterns using a pattern description language to create a glyph layout; and a graph-based pattern matching system for identifying potential matches amongst variable patterns in the glyph layout.

In a second aspect, the invention provides a computer program product stored on a computer usable medium for processing glyph-based data, comprising: program code configured for defining variable patterns using a pattern description language to create a glyph layout; and program code configured for identifying potential matches amongst variable patterns in the glyph layout.

In a third aspect, the invention provides a method for processing glyph-based data, comprising: providing a glyph layout having variable patterns; encoding each pattern into a pattern graph and store each pattern graph in a pattern dictionary; encoding the glyph layout into a layout graph in which nodes represent canonical features and edges represent interactions between features; and comparing features in the pattern graph to data in the pattern dictionary to identify potential matches.

BRIEF DESCRIPTION OF THE DRAWINGS

These and other features of this invention will be more readily understood from the following detailed description of the various aspects of the invention taken in conjunction with the accompanying drawings in which.

DETAILED DESCRIPTION OF THE INVENTION

Figure 1:
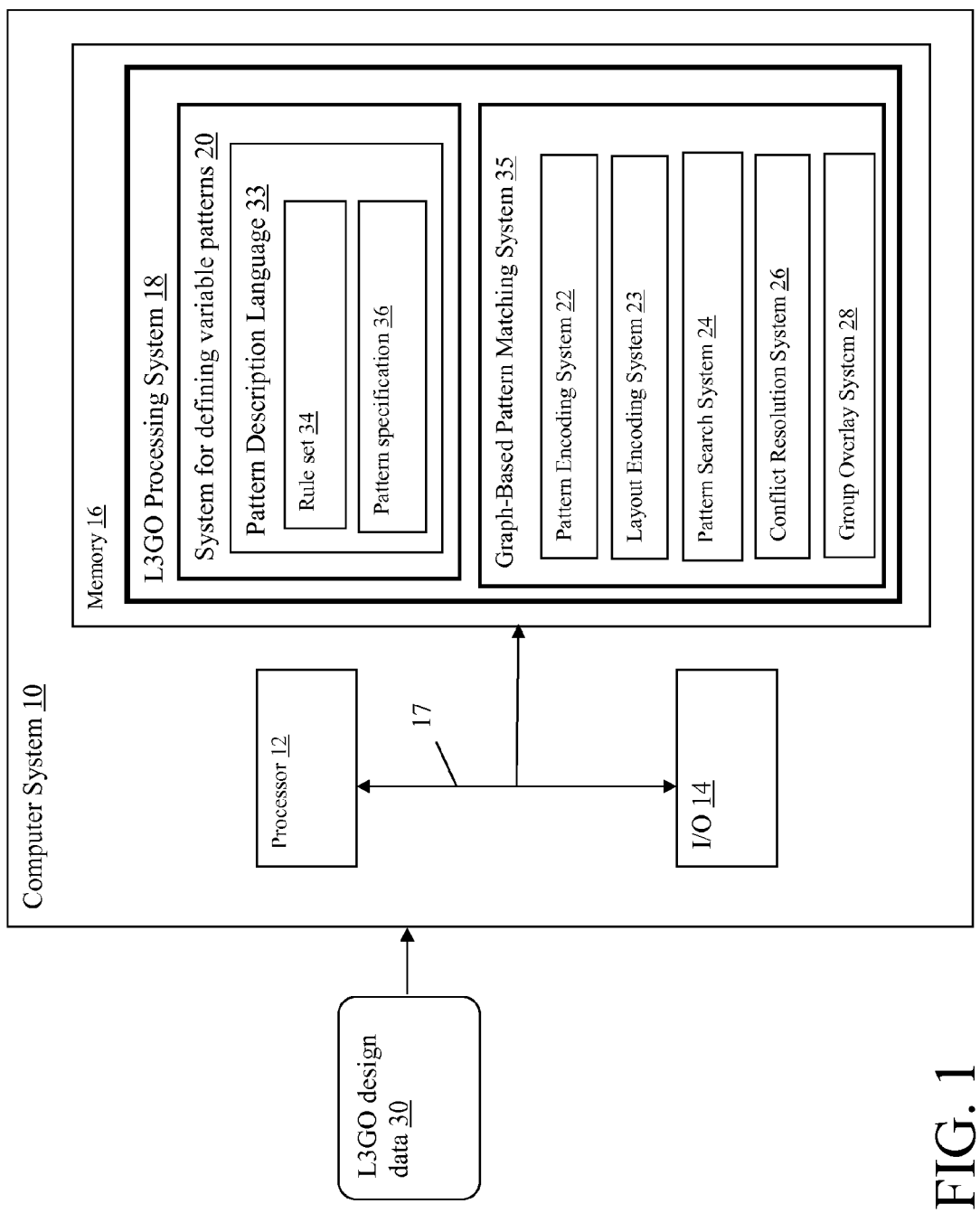
FIG. 1 depicts a computer system having an L3GO processing system in accordance with an embodiment of the present invention.

Referring now to drawings, FIG. 1 depicts a computer system 10 having an L3GO processing system 18 for generating and processing L3GO design data 30. L3GO processing system 18 includes a system for defining variable patterns 20 within L3GO layouts, and a graph-based pattern matching system 35 for identifying matching patterns in a L3GO layout. Note that while the illustrative embodiments are described with reference to an L3GO-based system, the invention could be applied to any now known or later developed glyph-based system for generating VLSI or other types of designs. Note also that while L3GO processing system 18 is shown as a stand-alone process, part of all it could be integrated into an elaboration system or process.

I. Pattern Description Language

The system for defining variable patterns 20 is implemented via a pattern description language 33 that provides a mechanism through which variable LG3O patterns can be defined. This alleviates the need to store the properties for thousands of different shapes. Instead, a set of generic shapes having parameters that vary can be provided, which can then be selected and located by a designer. For the purposes of this disclosure, the term variable pattern refers to a glyph (stick, point or area) in which one or more parameters, such a size, is left unresolved until a final layout is produced by an elaboration process.

Two features of the pattern description language 33 include the use of a rule set 34 and a pattern specification 36. Described herein is an illustrative syntax for implementing the pattern description language 33. However, it should be understood that the specific syntax discussed herein is not intended to be limiting, i.e., different syntax variations could be utilized without departing from the scope of the invention. Note that RX, PC and CA refer to names of VLSI design layers that correspond to lithography masks used in the manufacturing process.

Each target layer, i.e., a layer that is to be produced as the primary output of elaboration, requires a rule set 34. In the illustrative embodiment described herein, a rule set identifier is the name of the target layer, and the content of the rule set 34 is framed in brackets "{ }". The body of the rule set 34 contains the following statements in the listed order:

Exactly one BaseInput statement. The content of the BaseInput statement is framed in brackets "{ }". The content is a comma separated list of one or more identifiers that represent L3GO layers. The base input is a set of L3GO layers primarily correlated with the target layer, i.e., the set of layers that is transformed by the rule set.

Exactly one ContextInput statement. The body, framed by brackets "{ }", contains a comma separated list of zero or more identifiers that represent L3GO layers. The context input is a set of L3GO layers that influences the transformation of the base input into the target layer.

Exactly one Units statement. The body, framed by brackets "{ }", specifies the length unit used in pattern specification in nanometers. This unit is used for all distance specifications in the rule set 34.

An arbitrary number of Pattern statements (described below).

An example of a PC rule set 34 is as follows:

```
Ruleset(PC) {
BaseInput{ PC_L3GO, PCNC_L3GO}
ContextInput{ CA_L3GO, RX_L3GO}
Units{1 nm}
Pattern{...}
...
}
```

The difference between the base input and context input can be used for coverage checking. For example, requiring that a rule set 34 covers with its output regions all base inputs ensures that all input features are considered in patterns.

A pattern specification 36 consists of a topological description of a pattern, which basically describes design features and relationships between design features. The remaining parts of the pattern specification 36 provide additional filter criteria. A pattern specification 36 consists of the keyword "Pattern", followed by the pattern identifier framed in parenthesis "( )" and then followed by the pattern body framed in brackets "{ }". The pattern body has several sections, each framed in brackets "{ }", which have to appear in fixed order. The following is an example of a pattern specification 36:

```
Pattern(patternname) {
Parameters {...}
Elements {...}
Anchor {...}
Relations {...}
Constraints {...}
InputRegion {...}
OutputRegion {...}
Result {...}
Transforms {...}
}
```

Each of the sections of the pattern specification 36 is explained below. The parameter section declares variables. The strings declared as variable names can be used in an element specification and in constraints, and their actual value is determined by the pattern placement. For example:

Parameters {L,W,P}

Within the patterns, variables can appear in two forms. A variable must appear exactly once as specified in the parameters section and this reference is its defining usage. The defining usage determines which property of the pattern assigns a value to the parameter for a pattern placement with the actual corresponding pattern element. Defining usages of a variable may only occur in element statements.

The variable may also appear any number of times with the prefix '%' as referring usages. Referring usages simply apply the value captured by the defining usage when a pattern match occurs. Referring usages of variables may appear in the Elements, InputRegion, OutputRegion, Constraints and Results sections.

The Elements section of the pattern lists the glyphs and partial glyphs that are part of a pattern. Each statement has the form of an equation and assigns a symbol to a (partial) glyph. The following paragraphs describe the different element declarations.

1. Sticks

The statement: sticksuffix(layer, (x,y), direction, length, width, extint, crit( . . . )) declares a stick or partial stick, depending on the suffix. If there is no suffix, this indicates an entire stick glyph. Other possible suffixes are start, end and segment, indicating the beginning, end and interior of a stick glyph, respectively. The coordinates (x, y) are always at the beginning of the feature, i.e., for a stick end in direction right the end point is located at (x+length, y).

All forms of stick glyphs take the following arguments:
The input layer the stick resides on.
The location of the stick, represented by its x and y coordinates.
The direction of the stick, one of left, right, up or down.
The length of the stick, or stick portion. This is a suitable place for a defining variable without the prefix %.
The width of the stick. This is a suitable placement for a variable. (This means sticks in the input MUST carry a width attribute, otherwise the rule set has to specify a default).
A specification extint whether the element intersects the input region (entry int), does not intersect the input region (ext) or may do both (entry dnc).
The crit( ) argument lists interactions (intersect, mindist (min,max)) that are critical for a pattern match. If an interaction, e.g., intersect, is listed here, then the set of glyphs interacting in this form with the element in the pattern placement have to match exactly the listed interactions of the pattern. Otherwise additional interacting glyphs do not cause a mismatch. Each interaction listed in a crit( ) statement can carry a layer as an argument, which restricts critical interactions covered by this crit-entry to the specified layer.

2. Point Matrix

The statement: pointmatrix(layer, (x,y), Nx, Ny, Ox, Oy, Dx, Dy, size, extint, crit( . . . )) declares a point matrix glyph. A point matrix glyph takes the following arguments:

The input layer the point matrix glyph resides on.

The location of the origin of the point matrix glyph, represented by its x and y coordinates.

The number of vias in the point matrix glyph, Nx and Ny.

The offset of the center of the matrix from the origin, Ox and Oy.

The pitch of the vias in the point matrix glyph, Dx and Dy.

The nominal size of an individual via.

The specification of the relation to the input region is analogous to the stick statement.

The crit( ) argument lists interactions analogous to the stick statements.

3. Boundary

The statement boundarysuffix(layer, (x,y), direction, length, extint, crit( . . . )) declares a boundary or partial boundary, depending on the suffix. If there is no suffix, this indicates an entire boundary edge. Other possible suffixes are start, end and segment, indicating the beginning, end and interior of a boundary edge of a rectangle glyph, respectively. All forms of boundaries take the following arguments:

The input layer of the glyph that the boundary edge resides on.

The location of the boundary, represented by its x and y coordinates.

The direction of the boundary edge, one of left, right, up or down. Boundary edges are always oriented so that the interior portion of the corresponding region is to the left when proceeding along the boundary from its start point to its end point.

The length of the boundary edge, or edge portion. This is a suitable place for a defining variable without the prefix %.

The specification of the relation to the input region is analogous to the stick statement.

The crit( ) argument lists interactions analogous to the stick statements.

The following is an example that declares a stick, matrix and boundary:

```
Elements {
A = stickstart(PC__L3GO,(0,0),right,100, W, ext, crit( ));
B = pointmatrix(CA__L3GO,(P,0),1,1,0,0,0,0,S, int, crit(intersect);
C = boundarysegment(RX__L3GO,(%P,Q),down,2*Q, int, crit(intersect);
}
```

The anchor section specifies the type of anchor, framed in brackets "{ }", that serves as seed for the pattern matching and defines the origin of the coordinate system the pattern is specified in. The body of the anchor section specifies the element that is the seed for the pattern and which part of the element intersects the origin. The anchor is always located at the coordinates (0, 0) and points along the positive x axis.

There are two types of specifications for an anchor. The first anchor specification has the form <element:part>. The element is an element identifier from the elements section, the second part is one of the following specifiers:

s: Start point or a stick or boundary.
e: End point of a stick or boundary.
i: The interior of a stick or boundary.
p: The location of a point matrix.

The second anchor specification has the form <element#element>. This specification states the anchor position is located at the place where the two specified elements intersect. For example:

Anchor { A:s }
Anchor { A#C }

The relations section specifies the interactions between sticks. There must be a relation for each possible pairing of the listed elements. Each statement has the form of: element:part relationtype element:part Multiple relations are separated by commas. Each relation statement specifies which elements have an interaction and the relationtype specifies the type of interaction that occurs. An element refers to an identifier defined in the Elements section. The following example illustrates the syntax.

A intersects B,
B manhattanmindist(100,200) C,
D disjoint E

There are the following types of relationships:

manhattanmindist(min,max): Indicates that the minimal Manhattan distance between the indicated glyph parts has to be at least min and at most max. max has to be larger or equal than min and both values have to be larger than zero.

mindist(min,max): Indicates that the minimal distance in L-infinity metric between the indicated glyph parts has to be at least min and at most max. max has to be larger or equal than min and both values have to be larger than zero.

intersect or intersects is the special case of mindist(0,0).

disjoint or none indicates that there may be no interaction between the specified element parts.

The positive relations (i.e., intersection and distance based) have to form a spanning tree for the elements.

The constraints section allows for the specification of restrictions on the values of expressions, the value of the expression has to be within the specified closed interval. For example:

%L-%M in [0,infty];
%Q in [-infty,0];

The identifier infty indicates positive infinity.

The InputRegion section lists the input region of the pattern. The input region is only allowed to be intersected by glyphs on the input layers that are listed in the elements section as int or dnc. The declaration of the input region has the form InputRegion{ . . . }.

The regions are specified as sets of rectangles that can touch (i.e., abut), but not intersect. The syntax is as follows: rect((xlow,ylow), (xhigh,yhigh)), where xlow,ylow),xhigh, and yhigh represent the lower left and upper right coordinates of the rectangle. The values of these coordinates must be represented by either constants or referring usages of variables (variables preceded by the prefix '%'). Multiple rect specifications must be separated by commas. A region can be specified restricted to a single layer as LAYER={ ... }.

For example:

```
InputRegion {
  rect((-50,-125),(50,125)),
  RX_L3GO = {rect((-75,-75),(%P,75))}
}
```

The OutputRegion section lists the output region of the pattern. The declaration of the output region has the form OutputRegion{ ... }. The syntax of the output region is exactly the same as the syntax for the input region, except that no restriction to a layer is allowed.

The transforms section lists coordinate transforms under which the pattern may appear. The declaration of the transforms section has the form Transforms{ ... }. Within the braces, one or more of the following transform declarations are made, separated by commas.

identity: The identity transformation.

rot90, rot180, rot270: The three orthogonal rotations around the origin of the coordinate system.

mirror: Mirroring on the x-axis.

mrot90, mrot180, mrot270: Mirroring on the x-axis with subsequent rotation.

Note that each transform, including identity, has to be listed explicitly. For each transform that is specified a rule is generated in which the geometric components of the element specifications as well as for regions and results are transformed. Note that the variables are also transformed, i.e., a specification of (X, Y) is translated to (X, -Y) for 'mirror'. When the value is determined, any coordinate swapping or negation is considered. Note that the constraints section is not transformed.

In order for pattern description language 33 to allow the use of variables to describe patterns, the following requirements are also necessary. First, variables can only be used for positions of point features and closed ends of line features. Second, the input region has to be empty except for intersections with glyphs that are listed in the elements section as int or dnc. Third, the point set that is the result of the pattern has to be covered by the output regions. Fourth, the connectivity specified in the Relations section has to be exactly matched in the design for each node if the relation type is listed as critical. For example, a pattern consisting out of an isolated stick end with intersection listed as critical does not match a stick end that is part of an 'L'. Note that the interaction region adds an additional filter that may still cause a mismatch.

II. Graph-based Pattern Matching

Once an L3GO layout is defined using the pattern description language 33 described above, the layout can be processed by an elaboration system to generate a VLSI design. As noted, the ability to identify matching patterns in an L3GO layout greatly reduces the computational costs of the elaboration process. Accordingly, graph-based pattern matching system 35 is utilized to find matching patterns.

Graph-based pattern matching system 35 at its core utilizes a backtracking algorithm that looks for pattern graphs in a layout graph. Backtracking is a standard strategy for constraint satisfaction problems. An interesting aspect of this application is that not all values for the constrained variables are known during the backtracking problem. That is, some properties of the nodes of the pattern graph are not known at the time the corresponding layout object is found.

Pattern encoding system 22 provides the translation of L3GO patterns into pattern graphs, and layout encoding system 23 provides the translation of the L3GO layout (i.e., design) into a layout graph. Pattern encoding system 22 directly translates pattern elements into nodes, and relationships between nodes into edges (i.e., the pattern graph). The nodes carry the specified properties of the elements, the edges carry the type of interaction, e.g., that they intersect, etc. Each value in a node property, i.e., start coordinates, length, width attribute etc., is encoded as an expression. There are several types of expressions:

If a numerical value is provided in the pattern, the expression is a constant.

If an expression is a defining placement of a variable (without the % prefix), it is recorded as an un-initialized variable with a reference to the slot where the variable value and their state is stored. Initially, all variables are un-initialized.

If an expression containing variable uses (with the % prefix) is provided, the expression is translated into a byte code with references to the variables.

For each specified transform a separate pattern is created. Each property in a pattern element is transformed. For the starting point, the x and y coordinates are swapped and negated as necessary, the direction is changed and the properties of point glyph matrices are transformed (offset point by swapping and negating, number of rows and columns and pitch is just swapped). Note that for variables (uses and defining placements) the change in sign is recorded as a factor that is 1 or -1, respectively. The transformations take place for: the elements, the input and output regions, and the result. The constraints are not transformed.

Then for each pattern, a key is computed based on its anchor, i.e., the layer the anchor resides on, which feature (start or end), if it is an intersection, etc. The patterns are then stored in a dictionary based on those anchor keys. Each pattern graph is stored with an associated anchor key.

Layout encoding system 23, which encodes the L3GO layout into a graph, first requires the creation of a canonical representation of the L3GO layout. Point matrices are canonical as specified, but area and stick glyphs have to be processed. For each level with area glyphs, the area glyphs are unioned and then the outlines of the connected components are computed as a set of line segments. These line segments are the canonical features of the area glyphs.

Sticks are canonicalized in two phases. First all sticks that are parallel and overlap are merged if their width attributes are identical. If the widths are not identical, the glyph with the larger width erases the overlapped part of a stick with smaller width. In the second step, sticks are fractured so that the only interaction between sticks occurs at stick ends.

An intrusion search with an interaction distance equal to the maximum amongst the relationship distances and criticality statement distances is performed on the set of features that is obtained by the canonicalization process. The canonicalized features are mapped to nodes; the intrusions are mapped to edges and carry the minimum distance between the two features adjacent to the edge. The result of this process forms the layout graph.

For each pattern, a spanning tree rooted in the anchor features (i.e., the pre-matched node(s)) is computed. The construction of the spanning tree establishes an order that is used for the backtracking algorithm. The spanning tree is a subgraph of the pattern graph.

Pattern search system 24 finds all pattern matches in the layout graph by scanning through all the canonicalized features (i.e., boundary line segments, sticks and point matrix points). For each feature, subgraph searching system 24 looks in the pattern dictionary to see if there is a pattern that has an anchor that matches one of the segments, stick ends or the point matrix point. If there are anchors that were located on intersections of line features (boundary segments and sticks), a scan performs an intersection search (e.g., using a scan-line algorithm) to find potential anchors, and uses the intersection points to search in the pattern dictionary.

For all dictionary entries whose anchor matches the current position in the layout graph, a subgraph search is initiated. The subgraph search starts with a pre-match, i.e., the one or two elements that provided the potential anchor position are mapped to the one or two elements that defined the anchor in the pattern, respectively.

With the pre-match as a starting point, the backtracking is performed. Note that the algorithm has to find every pattern match; there may be multiple matches for the same pattern at the same anchor position.

The backtracking algorithm takes the next node Q in the spanning tree order that is not matched and finds the layout node L corresponding to its predecessor P in the spanning tree (P and L are matched at this point).

All the neighbors of L are tested for a match.

If a potential match is found (not all the node properties may be known yet due to uninitialized variables), the matching moves on to the next unmatched node as Q and goes to step one.

If no match is found with any neighbor of L, it un-matches the predecessor P and continues with P as an unmatched node.

If a complete match is found, the last match is reversed and the backtracking continues. Note that for each matched layout node the algorithm has to keep track on what neighbors had been tried so that it continues with new combinations when tracking back to that node.

Note that a challenge of the backtracking algorithm described above is that not all the properties required to make decisions are known at the time a match is made. Accordingly, to obtain decent performance, backtracking branches must be pruned as early as possible. Thus, for each match that is made, the currently defined variable values are determined and used for testing. When a match is undone, variables are reset to the undefined state accordingly. The first set of criteria that establishes matches is the topology of the elements and their relations. Since not all variable values are known, and thus not all conditions can be tested, this initial "partial" matching process may create matches that later are found to be incorrect. So as matches are created, values are assigned to variables, and when matches are reversed, these assignments are reversed.

Often a variable determines the actual size of the element, e.g., for a stick start that ends at the first CA that hits it, other CAs that hit the same stick further away in the layout and are thus adjacent in the layout graph do not really qualify as pattern candidates. Accordingly, the variable evaluation can actually have an influence on the topology component of the matching process.

A partial pattern match is implemented in form of a placement. A placement contains a reference to the pattern, the coordinates of the location where the pattern anchor is placed in the layout and a set of slots with values and states for the variables. During the matching process, each new match creates a new placement (potentially with more initialized variables), and the previous placements are stored on a stack. To backtrack, an old version of the placement is popped from the stack.

If a complete match was found, the last placement that is generated has all variables initialized. Then a sequence of further filters is applied as follows:

The pattern relations (i.e., edges) that are not part of the spanning tree are verified.
The critical interactions for the elements are tested.
The constraints are evaluated.
The content of the input region is checked.

Conflict resolution system 26 provides a mechanism for resolving conflicts when two or more patterns have output regions that overlap. The result of the subgraph search system (i.e., pattern search phase) is a complete set of pattern placements, i.e., the set contains all possible matches. A pattern placement consists of a pattern that was placed and the coordinate in the layout where the pattern anchor is situated to create the placement.

As mentioned above, there are often situations in which multiple patterns match that either are different grades of refinements of each other or that have overlapping pieces. Within each group of patterns (as defined in a rule set 34), a valid set of placements has to be found based on the pattern priorities so that there are no ambiguities. Two patterns are in conflict with each other if their output regions overlap. A placement of a pattern with higher priority prohibits the placement of a pattern with lower priority if their output regions overlap. Priority may be determined based on the order of specification within the group.

A complete set of placements is reduced to a valid set of placements by the following method:

A graph is constructed in which placements are nodes and overlaps between output regions are edges.
A node with the largest priority is chosen. It prohibits all adjacent matches of lower priority, so those nodes are removed from the graph.
The second step is repeated until the graph does not contain any edges.

Note that pattern placements with the same priority can overlap with each other. Since all patterns (and their transforms) have unique priorities, only two placements of the same pattern can overlap.

Group overlay system 28 provides a mechanism for overlaying groups based on their priorities. Each group is a sequence of patterns defined within a rule set 34, and the priority of each group may be determined by the order in which the group is defined. After resolving the conflicts among patterns (with a group), as described above, the result is a number of sets of valid placements, one set for each group. Group overlay system 28 overlays groups based on their priorities.

The group with the lowest priority is chosen and the result is generated for the group.
The output region of the next unprocessed group G (with the next higher priority) is selected, its output regions are unioned and the result is subtracted (difference operation) from what was computed as result so far. Then the result G is added (union).
Step two is repeated until all groups are processed.

Note that higher order groups can actually remove parts of the result from a previous group through empty parts of their output regions.

Figure 2:
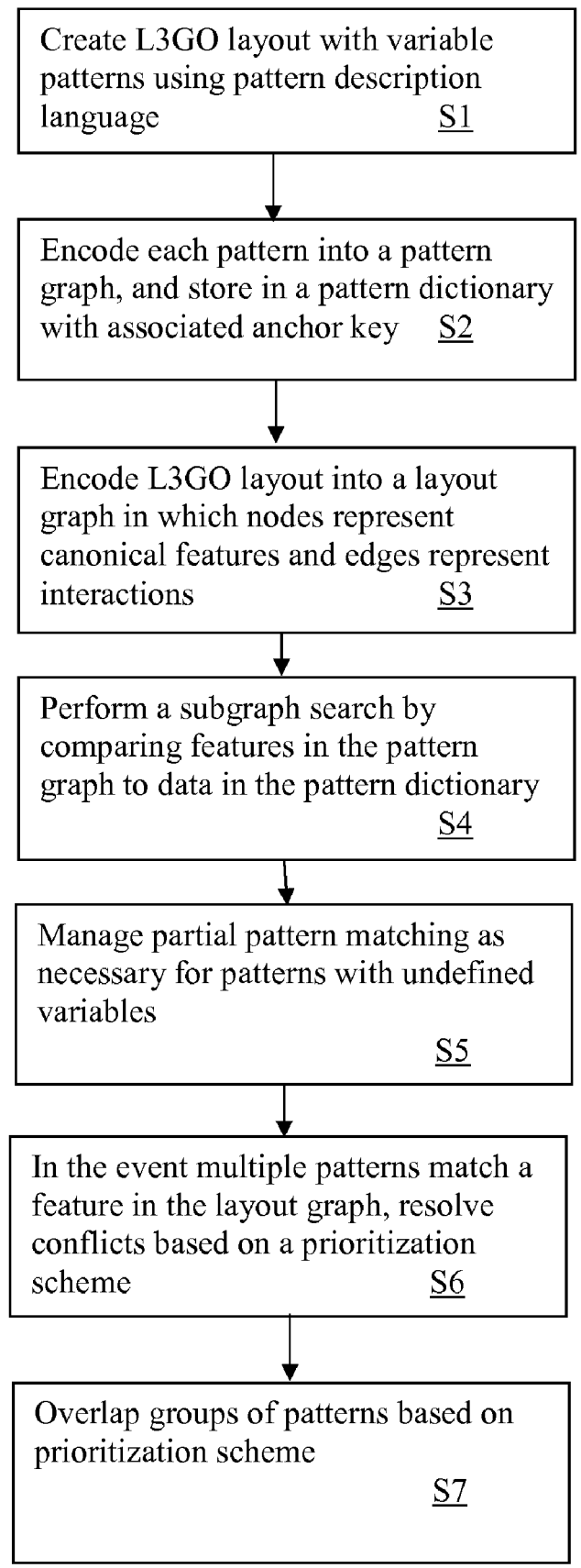
FIG. 2 depicts a flow chart showing a method of processing L3GO data in accordance with an embodiment of the present invention.

FIG. 2 depicts a flow diagram of a method of the present invention. At step S1, an L3GO layout is created with variable patterns using a pattern description language, such as that described above. At step S2, each pattern is encoded into a pattern graph and is stored in pattern dictionary with an associated anchor key. At step S3, the entire L3GO layout is encoded into a layout graph in which nodes represent canonical features and edges represent interactions between adjacent features. At step S4, a subgraph search is performed by comparing features in the layout graph to data in the pattern dictionary. At step S5, any partial pattern matching is managed (e.g., pruning using a stack) for patterns with undefined variables. At step S6, in the event multiple patterns match a feature in the layout graph, the conflicts are resolved with a pattern prioritization scheme. At step S7, conflicts among groups of patterns which form placements are addressed based on a group prioritization scheme.

III. Rule Sets

As noted above, RX, PC and CA refer to the names of VLSI design layers that correspond to lithography masks used in the manufacturing process. Each layer includes a set of rules for the specification of patterns.

The RX rules ensure that contacts are covered by a sufficient amount of RX. In this illustrative embodiment, only horizontal RX boundary edges are changed, and if a CA matrix point sits on a horizontal RX boundary, this RX boundary is moved out by 60 nm. The elaborated CA contact extends 45 nm from the point location, after the expansion RX extends at least 15 nm past the contact in vertical direction. RX has to extend at least 55 nm past the elaborated contact boundary in horizontal direction.

There are also restrictions point matrices have to satisfy that interact with RX. All points in a CA point matrix whose 'reference point' is located inside or on the boundary of an RX glyph have to be inside the same RX connected component. As a special case, it follows that a CA matrix with a reference on a horizontal RX boundary has to have exactly one row of points (i.e., since it is one dimensional). A point matrix with a reference inside of RX but not on the boundary that has one of its points on the boundary can have at most two rows and at most 2 columns.

The RX rule set, which has only one group, produces additive result shapes that are unioned with the area glyphs on RX_L3GO. Syntax for the rule set is as follows:

```
Ruleset(RX_ADD) {
BaseInput{RX_L3GO}
ContextInput{CA_L3GO,PC_L3GO}
Units{1nm}
```

The CA rules can conceptually be split into two types, contacts that interact with RX and contacts that interact with PC. For a point matrix whose reference point intersects an RX_L3GO area glyph, all points in the matrix have to intersect the same connected component of RX_L3GO. If the matrix has a point hitting an RX_L3GO boundary, then: (1) that boundary has to be horizontal; (2) the matrix has to have exactly one row and a vertical offset of zero if the reference point of the matrix is located on the boundary; and (3) the matrix has to be at most size two by two (and the offset is less than half a pitch for both x and y).

A pointmatrix whose reference point intersects a PC_L3GO or PCNC_L3GO glyph may have to move if the PC is shifted. The CA rule set has only one group and is defined with the syntax:

```
Ruleset(CA) {
BaseInput{CA_L3GO}
ContextInput{RX_L3GO, PCNC_L3GO}
Units{1nm}.
```

The PC rules have several groups for defining the PC layer, and are defined with the syntax:

```
Ruleset(PC) {
aseInput{PC_L3GO, PCNC_L3GO}
ContextInput{RX_L3GO, BP_L3GO, CA_L3GO}
Units{1nm}.
```

Figure 3:
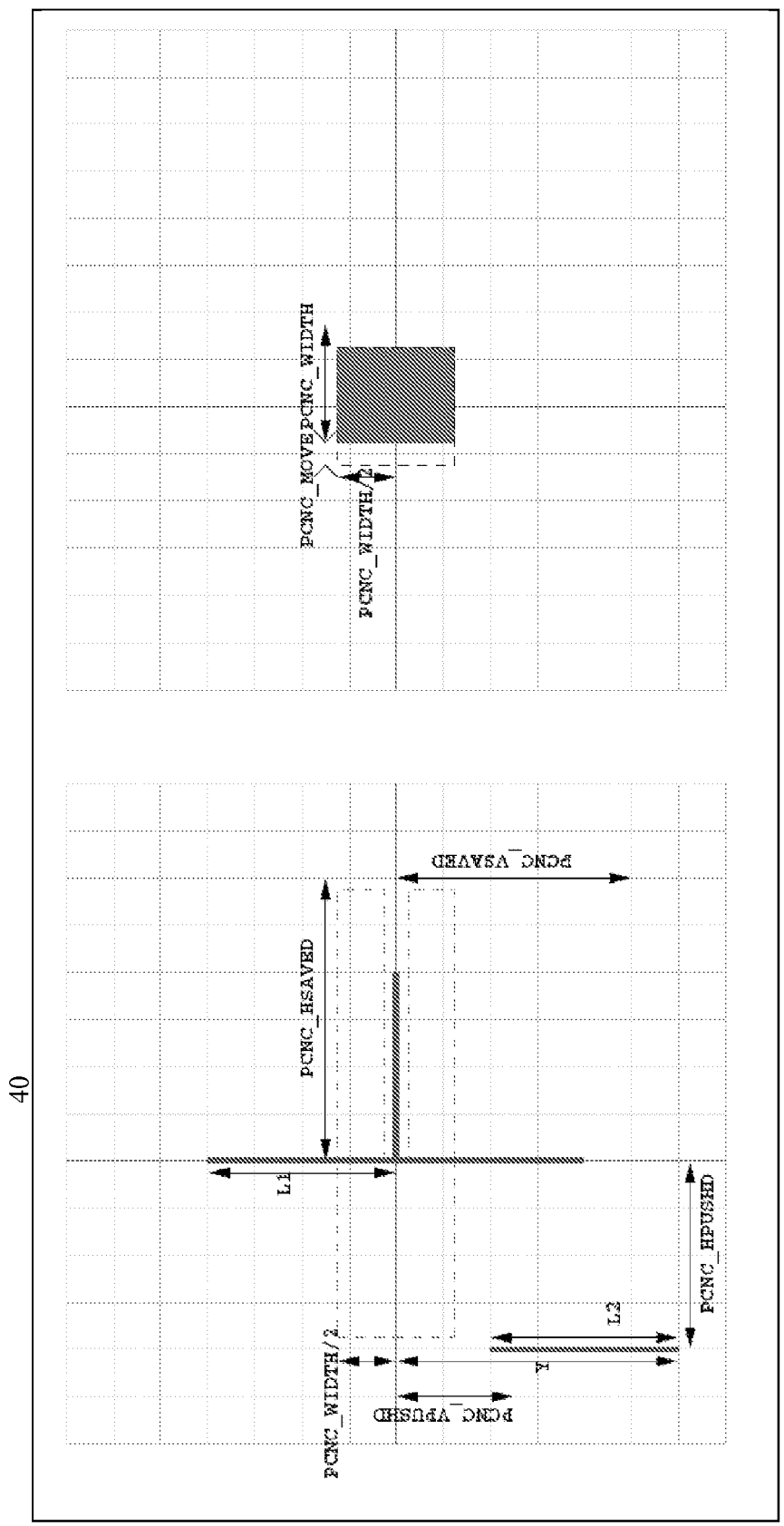
FIG. 3 depicts an example of the application of a rule for moving a PCNC "T" in accordance with an embodiment of the present invention.

The first group in the PC rule set elaborates the horizontal PC lines. A second group creates PC cover pads for CAs, taking into account that CAs may have moved. A third group utilizes decomposition into interiors and junctions to handle PCNC_L3GO and its interactions with PC_L3GO. The junction responsibility "areas" a region whose width and height is the PCNC target width. FIG. 3 depicts an illustrative application of a PC rule involving a PCNC "T" that has to be moved because it is too close to a neighbor. The code segment for implementing this move is as follows:

```
Pattern(PCNC_T_Move) {
  Parameters{L1,L2,W1,W2,W3,W4,Y}
  Elements {
    A = stickstart(PCNC_L3GO, (0,0), up, L1, W1, dnc,
      crit(none))
    B = stick (PCNC_L3GO, (-C_PCNC_HPUSHD,Y), up, L2,W2,
      dnc,
      crit(none))
    C = stickstart(PCNC_L3GO, (0,0), right, C_PCNC_WIDTH/2,
      W3,
      dnc, crit(none))
    D = stickstart(PCNC_L3GO, (0,0), down, C_PCNC_WIDTH/2,
      W4,
      dnc, crit(none))
  }
  Anchor{ A:s }
  Relations {
    A:sie mindist(C_PCNC_HPUSHD,C_PCNC_HPUSHD) B:sie,
    A:s intersect C:s,
    A:s intersect D:s,
    B:sie disjoint C:sie,
    B:sie disjoint D:sie,
    C:s intersect D:s
  }
  Constraints {
    %Y-C_PCNC_WIDTH/2 in [-infty,C_PCNC_VPUSHD],
    %Y+%L2+C_PCNC_WIDTH/2 in [-C_PCNC_VPUSHD,infty]
  }
  InputRegion {
    PCNC_L3GO = {rect ((-(C_PCNC_HPUSHD-1),-
      C_PCNC_WIDTH/2),(0,C_PCNC_WIDTH/2)),
      rect ((0,1),((C_PCNC_HSAVED-1),C_PCNC_WIDTH/2)),
      rect ((0,-C_PCNC_WIDTH/2),(C_PCNC_HSAVED-1,-1))},
    PC_L3GO = {rect ((-(C_PCNC_HPUSHD-1),-
      C_PCNC_WIDTH/2),(0,C_PCNC_WIDTH/2)),
      rect ((0,1),((C_PCNC_HSAVED-1),C_PCNC_WIDTH/2)),
      rect ((0,-C_PCNC_WIDTH/2),(C_PCNC_HSAVED-1,-1))}
  }
  OutputRegion {
    rect ((-C_PCNC_WIDTH/2,-
      C_PCNC_WIDTH/2),(C_PCNC_WIDTH/2,
      C_PCNC_WIDTH/2))
  }
  Result {
    rect ((-C_PCNC_WIDTH/2+C_PCNC_MOVE,
      -C_PCNC_WIDTH/2),
      (C_PCNC_WIDTH/2,C_PCNC_WIDTH/2))
  }
  Transforms{ identity, rot180, mirror, mrot180}
}
```

FIG. 3 shows a visualization of the pattern 'PCNC_T_Move', the pattern is shown on the left side, the result that is generated as well as the output region for the pattern are shown on the right side. The size markers (arrows and >< for small distances) correspond to the variables and constants in the pattern code shown above. Variables are declared in the 'Parameter' section of the pattern code, and the constants are defined externally and depend on the manufacturing technology. Note that an entire set of rules coded in this way can be updated to new technology parameters by updating only the definitions of the constants.

In general, computer system 10 (FIG. 1) may comprise any type of computer system and could be implemented as part of a client and/or a server. Computer system 10 generally includes a processor 12, input/output (I/O) 14, memory 16, and bus 17. The processor 12 may comprise a single processing unit, or be distributed across one or more processing units in one or more locations, e.g., on a client and server. Memory 16 may comprise any known type of data storage and/or transmission media, including magnetic media, optical media, random access memory (RAM), read-only memory (ROM), a data cache, a data object, etc. Moreover, memory 16 may reside at a single physical location, comprising one or more types of data storage, or be distributed across a plurality of physical systems in various forms.

I/O 14 may comprise any system for exchanging information to/from an external resource. External devices/resources may comprise any known type of external device, including a monitor/display, speakers, storage, another computer system, a hand-held device, keyboard, mouse, voice recognition system, speech output system, printer, facsimile, pager, etc. Bus 17 provides a communication link between each of the components in the computer system 10 and likewise may comprise any known type of transmission link, including electrical, optical, wireless, etc. Although not shown, additional components, such as cache memory, communication systems, system software, etc., may be incorporated into computer system 10.

Access to computer system 10 may be provided over a network such as the Internet, a local area network (LAN), a wide area network (WAN), a virtual private network (VPN), etc. Communication could occur via a direct hardwired connection (e.g., serial port), or via an addressable connection that may utilize any combination of wireline and/or wireless transmission methods. Moreover, conventional network connectivity, such as Token Ring, Ethernet, WiFi or other conventional communications standards could be used. Still yet, connectivity could be provided by conventional TCP/IP sockets-based protocol. In this instance, an Internet service provider could be used to establish interconnectivity. Further, as indicated above, communication could occur in a client-server or server-server environment.

It should be appreciated that the teachings of the present invention could be offered as a business method on a subscription or fee basis. For example, a computer system 10 comprising an L3GO processing system 18 could be created, maintained and/or deployed by a service provider that offers the functions described herein for customers. That is, a service provider could offer to provide graph-based pattern matching as described above.

It is understood that the systems, functions, mechanisms, methods, engines and modules described herein can be implemented in hardware, software, or a combination of hardware and software. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. In a further embodiment, part or all of the invention could be implemented in a distributed manner, e.g., over a network such as the Internet.

The present invention can also be embedded in a computer program product, which comprises all the features enabling the implementation of the methods and functions described herein, and which—when loaded in a computer system—is able to carry out these methods and functions. Terms such as computer program, software program, program, program product, software, etc., in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

The foregoing description of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

The invention claimed is:

1. A glyph-based processing system, comprising:
   a system for defining variable patterns using a pattern description language to create a glyph layout, wherein each variable pattern is defined with a construct that declares at least one variable for a selected property of an associated variable pattern; and
   a graph-based pattern matching system for identifying potential matches amongst variable patterns in the glyph layout.

2. The glyph-based processing system of claim 1, wherein the glyph layout comprises L3GO (Layout using Gridded Glyph Geometry Objects) design data.

3. The glyph-based processing system of claim 1, wherein the pattern description language includes a mechanism for defining a rule set and a pattern specification.

4. The glyph-based processing system of claim 3, wherein the rule set includes a set of pattern statements for defining patterns in a target layer that is to be produced by an elaboration process.

5. The glyph-based processing system of claim 3, wherein the pattern specification provides a topological description of a pattern.

6. The glyph-based processing system of claim 1, wherein the graph-based pattern matching system includes a pattern encoding system that converts a pattern into a pattern graph that includes a set of nodes and a set of edges, and wherein the pattern encoding system stores each pattern graph in a pattern dictionary along with a key that defines an anchor for the pattern graph.

7. The glyph-based processing system of claim 6, wherein the graph-based pattern matching system further includes a layout encoding system that encodes the glyph layout into a layout graph, wherein the layout encoding system creates a canonical representation of the set of glyph design data and wherein the layout graph includes nodes that store features of the canonical representation and edges that define interactions between adjacent features.

8. The glyph-based processing system of claim 7, wherein the graph-based pattern matching system further includes a sub-graph searching system that compares features in the layout graph with data in the pattern dictionary to locate matching patterns.

9. The glyph-based processing system of claim 8, wherein the graph-based pattern matching system further includes a conflict resolution system that resolves conflicts when multiple matching patterns are located.

10. The glyph-based processing system of claim 9, wherein the graph-based pattern matching system further includes a group overlay system that resolves patterns among pattern groups.

11. A computer program product stored on a non-transitory computer readable medium for processing glyph-based data, comprising:
   program code configured for defining variable patterns using a pattern description language to create a glyph layout, wherein each variable pattern is defined with a construct that declares at least one variable for a selected property of an associated variable pattern; and
   program code configured for identifying potential matches amongst variable patterns in the glyph layout.

12. The computer program product of claim 11, wherein the glyph layout comprises L3GO (Layout using Gridded Glyph Geometry Objects) design data.

13. The computer program product of claim 11, wherein the program code configured for identifying potential matches converts a pattern into a pattern graph that includes a set of nodes and a set of edges, and stores each pattern graph in a pattern dictionary along with a key that defines an anchor for the pattern graph.

14. The computer program product of claim 13, wherein the program code configured for identifying potential matches further encodes the glyph layout into a layout graph by creating a canonical representation of the glyph layout, wherein the layout graph includes nodes that store features of the canonical representation and edges that define interactions between adjacent features.

15. The computer program product of claim 14, wherein the program code configured for identifying potential matches compares features in the layout graph with data in the pattern dictionary to locate matching patterns.

16. The computer program product of claim 15, wherein the program code configured for identifying potential matches resolves conflicts when multiple matching patterns are located.

17. The computer program product of claim 15, wherein the program code configured for identifying potential matches resolves patterns among pattern groups.

18. A method for processing glyph-based data, comprising:
   providing a glyph layout having variable patterns;
   encoding each pattern into a pattern graph and store each pattern graph in a pattern dictionary;
   encoding the glyph layout into a layout graph in which nodes represent canonical features and edges represent interactions between features; and
   comparing, by a computer, features in the pattern graph to data in the pattern dictionary to identify potential matches.

19. The method of claim 18, further comprising processing partial pattern matches that involve patterns with undefined variables.

20. The method of claim 18, further comprising:
   resolving conflicts among multiple patterns that match a feature in the layout graph based on a prioritization scheme; and
   resolving conflicts placements that include a group of patterns by overlaying placements based on a prioritization scheme.

* * * * *